United States Patent [19]

Lane

[11] 4,261,772
[45] Apr. 14, 1981

[54] METHOD FOR FORMING VOLTAGE-INVARIANT CAPACITORS FOR MOS TYPE INTEGRATED CIRCUIT DEVICE UTILIZING OXIDATION AND REFLOW TECHNIQUES

[75] Inventor: Edward R. Lane, Sunnyvale, Calif.

[73] Assignee: American Microsystems, Inc., Santa Clara, Calif.

[21] Appl. No.: 55,170

[22] Filed: Jul. 6, 1979

[51] Int. Cl.³ .................. H01L 21/283; H01L 21/306
[52] U.S. Cl. .................. 148/174; 29/576 C; 29/571; 29/577 R; 29/578; 148/1.5; 148/187; 156/653; 156/657; 156/662; 357/45; 357/51; 357/54; 357/59; 357/23; 427/86; 427/93
[58] Field of Search .................. 148/1.5, 174, 187; 29/576 C, 571, 577, 578; 156/653, 657, 662; 427/86, 93; 357/23, 45, 51, 54, 59

[56] References Cited

U.S. PATENT DOCUMENTS

| 3,860,836 | 1/1975 | Pedersen | 357/51 X |
|---|---|---|---|
| 3,893,146 | 7/1975 | Heeren | 357/51 X |
| 3,986,903 | 10/1976 | Watrous | 148/187 |
| 4,035,820 | 7/1977 | Matzen | 357/54 X |
| 4,055,444 | 10/1977 | Rao | 148/187 X |
| 4,102,733 | 7/1978 | DeLaMoneda | 357/59 X |
| 4,110,776 | 8/1978 | Rao et al. | 357/23 X |
| 4,125,933 | 11/1978 | Baldwin et al. | 29/571 |
| 4,191,603 | 3/1980 | Garbarino et al. | 427/95 X |
| 4,204,894 | 5/1980 | Komeda et al. | 148/187 X |
| 4,214,917 | 7/1980 | Clark et al. | 148/174 X |

Primary Examiner—R. Dean
Assistant Examiner—W. G. Saba
Attorney, Agent, or Firm—Alan H. MacPherson

[57] ABSTRACT

For an integrated circuit semiconductor device having a multiplicity of MOSFET elements, voltage-invariant capacitors, each with metal as one plate and either polysilicon or source-drain diffusion as the second plate, are created by regrowing a thin oxide layer to provide the dielectric of the capacitor during the normal MOSFET processing sequence.

4 Claims, 4 Drawing Figures

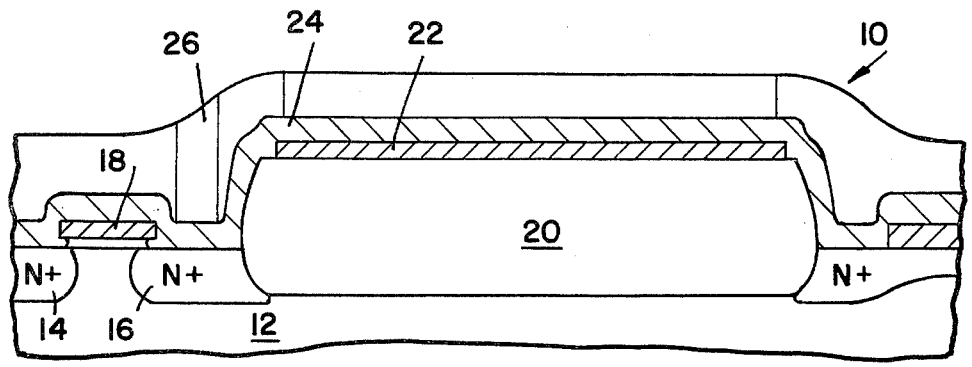
FIG_1
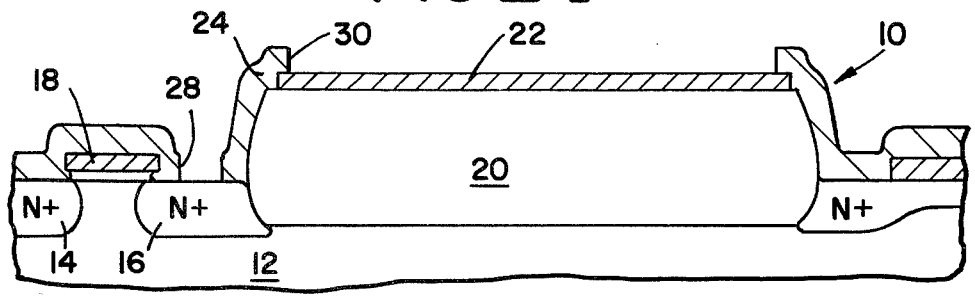
FIG_2
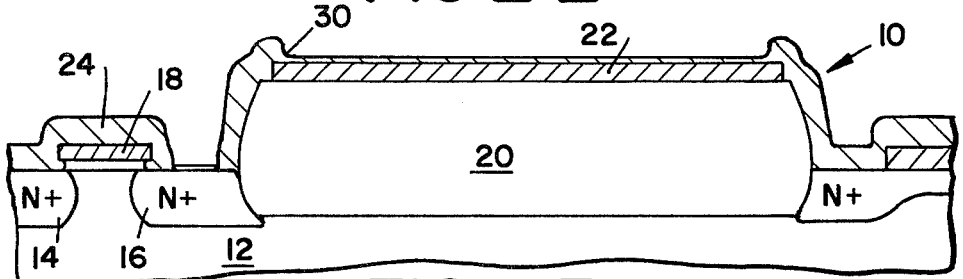
FIG_3
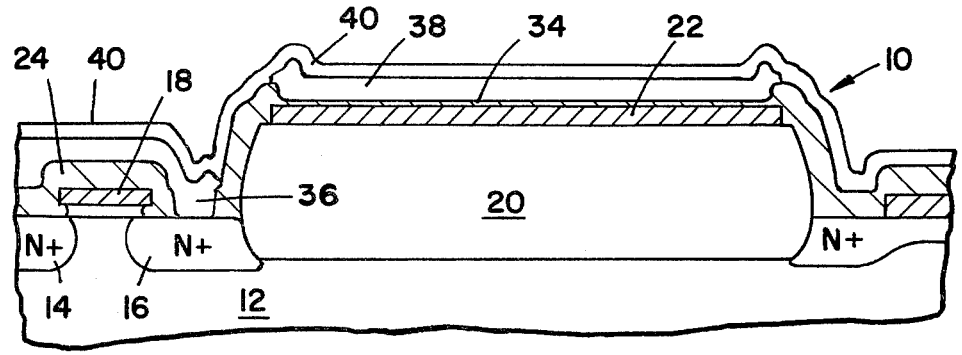
FIG_4

METHOD FOR FORMING VOLTAGE-INVARIANT CAPACITORS FOR MOS TYPE INTEGRATED CIRCUIT DEVICE UTILIZING OXIDATION AND REFLOW TECHNIQUES

BACKGROUND OF THE INVENTION

This invention relates to integrated circuit semiconductor devices having voltage invariant capacitor elements, and more particularly, to a method for making such devices.

In certain types of relatively large integrated circuits, it is necessary to provide numerous voltage invariant capacitors in addition to the many transistors used for logic or memory sections. For example, in integrated circuits such as microprocessors or devices used for digital data transmission and communication systems, such as coder-decoder circuits, analog to digital and/or digital to analog converters are formed from capacitor ladders comprised of large numbers of capacitors, all of which must be sized to specifications within close tolerance limits.

Heretofore, in order to provide the necessary capacitor elements in an integrated circuit comprised of many transistors, separate process steps were required to form external capacitor elements. This greatly increased the cost of such integrated circuits. Moreover, it adversely affected the production yield attainable because of process complications and it required integrated circuit chips of greater area. The present invention provides a solution to this problem.

BRIEF SUMMARY OF THE INVENTION

It is, therefore, one object of the present invention to provide a new and improved process for making integrated circuit devices with a multiplicity of transistors and capacitors.

Another object of the present invention is to provide a process for making MOS-type integrated circuit devices also having numerous capacitors wherein the dielectric layer for the capacitors is formed by an oxide regrowth during the processing steps for the MOS elements.

Yet another object of the present invention is to provide a process for making MOS-type integrated circuit devices having numerous transistors and relatively large capacitors wherein the specified design capacitance of the capacitors does not vary appreciably with applied voltage.

In accordance with the principles of the invention, an integrated semiconductor device having both transistors and numerous capacitors is made by first using conventional processing steps. For example, with N-channel devices, the P doped substrate is marked and treated in the conventional manner to provide N+ diffused regions and field oxide areas. Polycrystalline silicon is formed in the gate areas for the N-channel transistors and also in preselected regions on the upper surface of prescribed field oxide areas. At this point, the device is normally covered with a layer of phosphorous doped oxide (vapox).

During the basic silicon gate process, a contact mask of photoresist material is normally used with ultraviolet light to define gate and contact regions wherein the phosphorous doped oxide is thereafter etched away. Following this etching step the oxide edges are nearly vertical and the corners are too sharp to allow good metal step coverage when metal is subsequently deposited. To remove these edges and allow good metal step coverage, a procedure heretofore used was to subject the wafer to heat in an ambient that causes the oxide to become slightly molten. This so-called "reflow" process results in sloped edges and rounded corners on the oxide material. In the present invention, prior to any reflow step, a contact mask is used to define and etch away areas where capacitors are to be formed. Now as the aforesaid reflow step is applied at a controlled ambient temperature level, not only are the sharp oxide edges rounded and smoothed off, but a thin oxide layer is grown in field oxide areas designated by the contact mask to form capacitors. Thereafter, another oversized contact mask is used to retain the thin oxide layer in the capacitor areas while clearing out the oxide in the desired contact areas. The thin oxide thus retained in the capacitor areas forms the required dielectric between a subsequently deposited layer of metal and the polycrystalline silicon gate of the MOS device. The result is an electrically efficient capacitor whose physical dimensions and electrical characteristics can be predetermined and controlled within the required close tolerances. Yet, the process for forming such capacitors on the same chip with a multiplicity of MOS transistors is completely compatible with the conventional process.

Other objects, advantages and features of the invention will become apparent from the following detailed description presented with the accompanying drawing.

BRIEF DESCRIPTION OF THE DRAWING

FIG. 1 is a view in elevation and is a section of a partially completed semiconductor device in the process of being formed in accordance with the principles of the present invention;

FIG. 2 is a view similar to FIG. 1, showing portions of an upper layer of photoresist material etched away to expose contact and capacitor areas;

FIG. 3 is a view similar to FIG. 2, showing a thin oxide layer in the contact and capacitor areas; and FIG. 4 is a view similar to FIG. 1, showing the same section of semiconductor device as it appears when completed with its capacitor in place.

DETAILED DESCRIPTION OF THE EMBODIMENT

With reference to the drawing, FIG. 1 shows in crosssection, a portion of a partially fabricated N-channel MOS device 10 as it appears before a metallization layer for contacts has been applied. The method steps for fabricating the semiconductor structure to this point are well-known and can be accomplished using conventional techniques. As shown, a silicon substrate 12 typically has spaced-apart N+ diffused regions 14 and 16 that form the source and drain of an MOS device having a polycrystalline silicon gate 18 extending between these source and drain regions. Separating MOS elements on the substrate is a relatively thick field oxide region 20 which is also covered by a polycrystalline silicon layer 22, having a thickness in the range of 3500 to 4500 Å. Covering the entire chip area at this point, including N+ diffused regions, the polycrystalline gates and field oxide layer, is another layer 24 of phosphorous doped oxide (vapox). This latter layer must be removed at certain locations to expose the substrate surface and provide areas for subsequent metal contacts with each MOS device. Therefore, another layer 26 of polymerized photoresist material is formed over the vapox layer 24. Using conventional techniques, this photoresist layer is converted to a contact mask by forming unpolymerized photoresist in selected areas so that the vapox can be removed in these selected areas by a suitable etchant to provide the MOS device contact areas. In accordance with the present invention, this contact mask is also formed with unpolymerized areas to provide for capacitors on the polycrystalline silicon layer in the field oxide area.

Thus, after the aforesaid etching step, the structure appears as shown in FIG. 2 with a relatively small contact opening 28 over the N+ diffusion 16 and a relatively large opening 30 to the exposed polysilicon layer 22. At this point, the etching process has created sharp edges on the etched borders of the vapox layer for the openings 28 and 30. These sharp edges in the contact area are undesirable because they prevent good metal step coverage and cause possible fractures or discontinuities within subsequently deposited metal.

Now, to form the dielectric layer for each capacitor of the integrated circuit device according to the invention, a reflow cycle is performed. During this step, the entire chip is heated in an ambient of oxygen to a temperature of around 1070 degrees centigrade. At this point, as shown in FIG. 3, thin oxide layers 32 and 34 are grown in the exposed areas within the opening 28 and 30. The layer 34 will eventually form the intermediate dielectric layer for the capacitor. By controlling the amount of heat, in other words, the time of heat application and the temperature, the thickness of the dielectric layer 34 can be controlled to the desired limits (e.g. 650 to 750 Å).

When the aforesaid reflow cycle is complete, it is necessary to remove the oxide layer 32 from the MOS contact area before metal can be deposited. Thus, another mask is utilized which has openings or features slightly larger (e.g., 1 micron per side) than those for the contact openings on the contact mask. This latter mask has no opening for the capacitor areas in which the thin dielectric layer 34 has been formed. Thus, when this latter mask is used, the oxide layer 32 is removed from all of the MOS contact areas, and thereafter, the device is ready for metallization.

During conventional techniques, a layer of metal is deposited using a metallization mask (not shown) configured so that a metal contact 36 is formed in the opening 28 over an N+ diffusion region and a metal plate 38 is formed over the thin dielectric layer to complete the capacitor. (See FIG. 4). The capacitor thus is comprised of the top metal layer 38, the thin intermediate dielectric layer 34 and the bottom conductive layer 22 of polysilicon. A suitable contact or lead extending to the top layer is not shown, but may be provided wherever convenient. Covering the entire device is a protective passivation layer 40 which is applied in the usual manner.

From the foregoing, it should be apparent that the present invention provides a highly efficient and economical method for producing semiconductor devices with both MOS transistors and voltage invariant capacitors. The invention thus solves the problem of economically manufacturing large numbers of multi-function chips wherein logic, memory and analog-to-digital (or vice-versa) capabilities, using large capacitor arrays are required.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A method for fabricating a semiconductor device having MOS transistors and voltage invariant capacitors comprising the steps of:

forming on a silicon substrate, pairs of preselected diffused regions having the opposite conductivity from that of said substrate and field oxide regions adjacent said diffused regions;

forming a layer of conductive material in gate areas between diffused regions of said pairs and in preselected areas on said field oxide regions;

covering said substrate, including said diffused regions, said areas of conductive material and said field oxide, with a layer of phosphorous doped oxide;

forming openings in said layer of phosphorous doped oxide, including contact areas, aligned with preselected diffused regions and also, preselected capacitor areas of said layer of conductive material on said field oxide;

reflowing said phosphorous doped oxide by heating in an oxygen ambient to reduce sharp edges at said openings and simultaneously grow a thin oxide layer in said contact and capacitor areas;

removing the thin oxide layer in said contact areas;

providing a layer of metal in said contact areas and also in said capacitor areas, thereby forming the upper conductor plate of the capacitor.

2. The method as described in claim 1, wherein said thin oxide layer is formed to a thickness between 650–750 Å.

3. The method as described in claim 1, wherein said layer of conductive material is polycrystalline silicon, having a thickness in the range of 3500 to 4500 Å.

4. The method as described in claim 1, wherein the removal of the thin oxide layer in said contact areas is accomplished with a mask having openings for the contact areas that are slightly larger than the openings in the mask for originally forming the openings in the phosphorous doped oxide.

* * * * *

UNITED STATES PATENT AND TRADEMARK OFFICE
CERTIFICATE OF CORRECTION

PATENT NO. : 4,261,772
DATED : April 14, 1981
INVENTOR(S) : Edward R. Lane, Sunnyvale, California It is certified that error appears in the above—identified patent and that said Letters Patent is hereby corrected as shown below:

In FIG - 3 insert the numerals --32-- together with a line pointing to the thin oxide layer on the top surface of N+ diffused region 16;

Column 1, line 11, delete "ments, and more particularly," and insert --ments and, more particularly,--;

Column 1, line 43, delete "regrowth" and insert --grown--;

Column 2, line 47, delete "cros" and insert --cross---;

Column 2, line 48, delete "ssection" and insert --section--;

Column 3, line 27, delete "opening" and insert --openings--.

Signed and Sealed this

Twenty-eighth Day of December 1982

[SEAL]

Attest:

Attesting Officer

GERALD J. MOSSINGHOFF

Commissioner of Patents and Trademarks